US 6,731,564 B1

(12) United States Patent
Tran et al.

(10) Patent No.: US 6,731,564 B1
(45) Date of Patent: May 4, 2004

(54) METHOD AND SYSTEM FOR POWER CONSERVATION IN MEMORY DEVICES

(75) Inventors: Tam M. Tran, Austin, TX (US);
George B. Jamison, Murphy, TX (US);
Bryan D. Sheffield, Rowlett, TX (US);
David J. Toops, Terrell, TX (US);
Vikas K. Agrawal, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/391,006

(22) Filed: Mar. 18, 2003

(51) Int. Cl.[7] .................................................. G11C 7/00
(52) U.S. Cl. .................... 365/229; 365/227; 365/203
(58) Field of Search ................................. 365/229, 227, 365/226, 230.06, 203, 222

(56) References Cited

U.S. PATENT DOCUMENTS 4,796,227 A * 1/1989 Lyon et al. ................. 365/154
6,343,045 B2 * 1/2002 Shau ........................... 365/227

* cited by examiner

Primary Examiner—Gene Auduong
(74) Attorney, Agent, or Firm—Alan K. Stewart; W. James Brady, III; Frederick J. Telecky, Jr.

(57) ABSTRACT

According to one embodiment of the invention, a memory circuit operable to assume a standby mode is provided. A memory circuit includes a transistor comprising a gate and a bulk. The bulk is at a retention voltage level. The memory circuit also includes a first node and a second node that are coupled to each other by the transistor. The first node is operable to assume a higher voltage level than the second node in response to an initiation of the standby mode. The memory circuit also includes a third node coupled to the gate of the transistor. The third node is operable to assume a voltage approximately equal to the retention voltage in response to an initiation of the standby mode. The transistor is operable to reduce any direct current flow between the first node and the second node in response to a rise in voltage at the third node to a voltage approximately equal to the retention voltage.

20 Claims, 2 Drawing Sheets ly significant power drain when the device is in a standby mode due to current leakage from higher voltage nodes to lower voltage nodes. Because of the high level of leakage current, the DC power source of the electronic device may be completely drained within a short period of time even when the device is turned off. Therefore, a user of the device

METHOD AND SYSTEM FOR POWER CONSERVATION IN MEMORY DEVICES

TECHNICAL FIELD OF THE INVENTION

This invention relates generally to semiconductor devices and more particularly to a method and system for power conservation in memory devices.

BACKGROUND OF THE INVENTION

Many electronic devices in today's society utilize static random access memory ("SRAM"), which is a memory that loses its data upon loss of normal operating power. Many devices using SRAM are designed to be portable, which requires the use of a battery as a power source. One limitation for such portable devices is the life of the battery. To prolong the life of the battery while preserving the data stored in the SRAM, many portable devices are capable of shutting down normal operating power while continuing to provide a lower voltage for the SRAM for data maintenance. This is commonly referred to as a standby mode. An example of a device operable to assume a standby mode is a cellular phone.

A problem with such an approach is that leakage of direct current occurs during the standby mode, which may drain the battery power after a certain amount of time. Thus, the portability of the device may be limited due to the need to recharge or replace the battery.

SUMMARY OF THE INVENTION

According to one embodiment of the invention, a memory circuit operable to assume a standby mode is provided. A memory circuit includes a transistor comprising a gate and a bulk. The bulk is at a retention voltage level. The memory circuit also includes a first node and a second node that are coupled to each other by the transistor. The first node is operable to assume a higher voltage level than the second node in response to an initiation of the standby mode. The memory circuit also includes a third node coupled to the gate of the transistor. The third node is operable to assume a voltage approximately equal to the retention voltage in response to an initiation of the standby mode. The transistor is operable to reduce any direct current flow between the first node and the second node in response to a rise in voltage at the third node to a voltage approximately equal to the retention voltage.

Some embodiments of the invention provide numerous technical advantages. Some embodiments may benefit from some, none, or all of these advantages. For example, according to one embodiment, the battery life of an electronic device is prolonged by blocking the leakage current flowing from its memory circuit while the device is in a standby mode. According to another embodiment, gate leakage is minimized by adjusting the level of voltage applied to the gate of a transistor that is blocking the leakage current. According to another embodiment, the number of components required to minimize the level of current leakage is reduced by minimizing the number of leakage paths.

Other technical advantages may be readily accertained by one of skill in the art.

BRIEF DESCRIPTION OF THE DRAWINGS

Reference is now made to the following description taken in conjunction with the accompanying drawings, wherein like reference numbers represent like parts, in which.

DETAILED DESCRIPTION OF EXAMPLE EMBODIMENTS OF THE INVENTION

Embodiments of the invention are best understood by referring to FIGS. 1 through 3C of the drawings, like numerals being used for like and corresponding parts of the various drawings.

Figure 1:
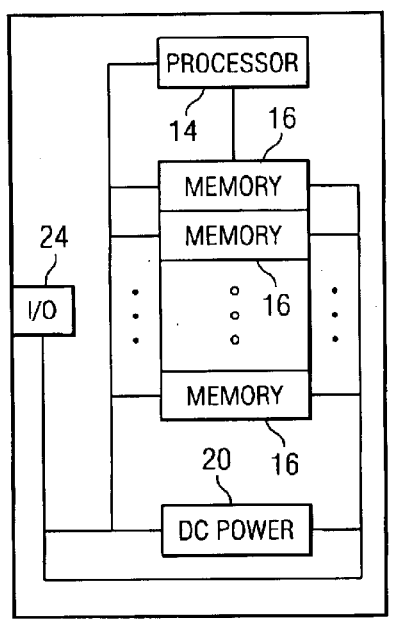
FIG. 1 is a schematic diagram illustrating one embodiment of an electronic device that may benefit from the teachings of the present invention.

FIG. 1 is a schematic diagram illustrating an electronic device 10 that may benefit from the teachings of the present invention. Examples of electronic device 10 include a cellular phone, a personal digital assistant ("PDA"), a camcorder, a digital camera, or any other device that may incur current leakage while in a standby mode.

Electronic device 10 comprises a processor 14, one or more memory chips 16, such as SRAM chips, a direct current power source 20, and a power switch 24. Processor 14 is coupled to memory chip 16 and DC power source 20. Switch 24 is coupled to DC power source 20 so that switch 24 may control the power provided to other components of device 10. Processor 14 may be any suitable device operable to process data and execute programs. Examples of processor 14 include PENTIUM series processors, available from Intel Corporation. Memory chip 16 may be any device operable to store data and allow the data to be accessed by processor 14. In one embodiment, memory chip 16 may be SRAM chips. DC power source 20 may be any device operable to provide direct current power to the components of device 10. An example of DC power source 20 is a battery. Power switch 24 may be any switch operable to start or stop the normal operation of device 20 by controlling the flow of power from DC power source 20 to the components of device 10. When device 10 is turned off using switch 24, switch 24 may be operable to initiate a standby mode so that the data stored in memory chips 16 may be preserved. For example, switch 24 may turn off the power to processor 24 but continue to provide a retention voltage to memory chip 16. A "standby mode" refers to turning off the normal operating power of a device while providing a lower voltage to the memory, such as SRAM, to maintain the integrity of the data stored in the memory. For example, a cellular phone assumes a standby mode when the cellular phone is turned off but the battery of the cellular phone continues to provide the required voltage to maintain data that is stored in a memory of the cellular phone. The voltage level required to maintain data in the memory is referred to as "retention voltage," or "$V_{RET}$." "Standby mode" may also be referred to as "retention mode."

Conventional electronic devices may suffer from relatively significant power drain when the device is in a standby mode due to current leakage from higher voltage nodes to lower voltage nodes. Because of the high level of leakage current, the DC power source of the electronic device may be completely drained within a short period of time even when the device is turned off. Therefore, a user of the device is required to replace or recharge the power source frequently, which may be inconvenient.

According to some embodiments of the present invention, an apparatus and a method are provided that increase the life of a battery for an electronic device by reducing the level of current leakage during the standby mode. In one embodiment, current leakage is reduced by identifying and blocking leakage paths in a memory circuit. In another embodiment, a memory circuit is configured to minimize the number of leakage paths, which allows a fewer number of devices to be used to block the leakage current. In another embodiment, the level of voltage applied to the transistors blocking the leakage current is adjusted to reduce the level of gate leakage. Additional details of example embodiments of the invention are described below in conjunction with FIGS. 2 through 3C.

Figure 2:
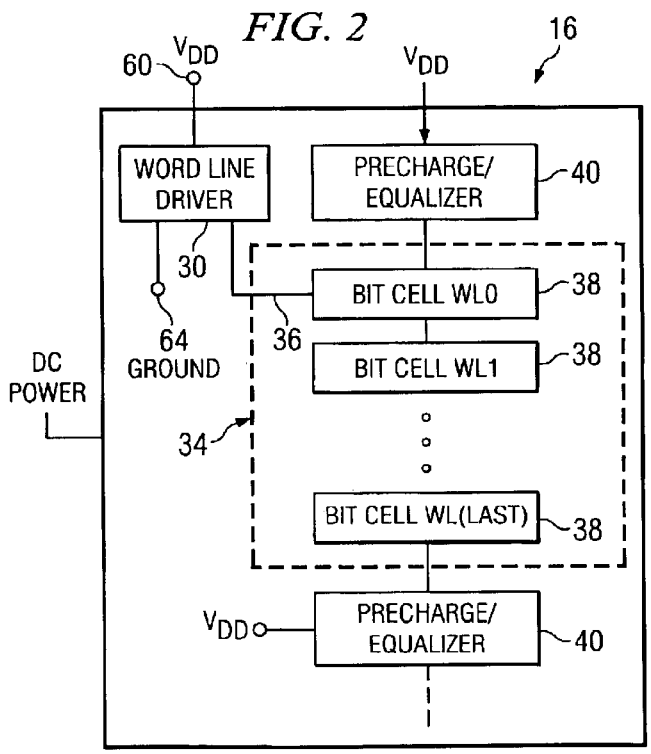
FIG. 2 is a block diagram illustrating one embodiment of a memory shown in FIG. 1.

FIG. 2 is a block diagram illustrating one embodiment of memory 16. Memory 16 comprises a wordline driver 30 coupled to a bit array 34 through a wordline 36. Memory 16 also comprises pre-charge circuits 40 coupled to bit array 34 through a bit line and a bit line bar (the bit line and bit line bar are not explicitly shown in FIG. 2). Wordline driver 30 is operable to control the writing in and the reading out of data stored in bit array 34 through wordline 36. Bit array 34 is formed from a plurality of bit cells 38. Each bit cell 38 is operable to store and maintain data during a standby mode. Precharge/equalize circuit 40 is operable to equalize and precharge bitlines and bitlines bar to memory array active power supply voltage ("$V_{DD}$") during a cycle commonly referred to as "memory precharge cycle." This circuit 40 may be turned off during memory access cycle. In one embodiment, bit cells 38 are linearly arranged, end to end, so that bit array 34 has two ends, as shown in FIG. 2 (and also in FIG. 3B). In one embodiment, pre-charge circuits 40 are respectively placed at the two ends of bit array 34. This is advantageous in some embodiments of the invention because positioning bit array 34 between two pre-charge circuits 40 consolidates some of the leakage paths at the two ends of bit array 34.

Wordline driver 30 is coupled to an active voltage ("$V_{DD}$") node 60, a ground node 64, and wordline 36. When device 10 assumes a standby mode, the normal operating power is turned off. Thus, $V_{DD}$, node 60 assumes the same voltage level as ground node 64, which is equal to zero volts in some instances. However, because wordline 36 couples wordline driver 30 to bit array 34 that is receiving retention voltage, certain nodes within bit array having a higher voltage than nodes 60 and 64 cause leakage current to flow from bit array 34 through wordline 36 and out to nodes 60 and 64. Thus, some current paths of wordline driver 30 become leakage current paths when device 10 assumes a standby mode. According to one embodiment of the invention, wordline driver 30 is isolated to reduce current leakage by blocking the leakage paths between wordline 36 and nodes 60 and 64. Additional details of wordline driver 30, bit array 34 and pre-charge circuits 40 are provided in conjunction with FIGS. 3A and 3B.

Figure 3A:
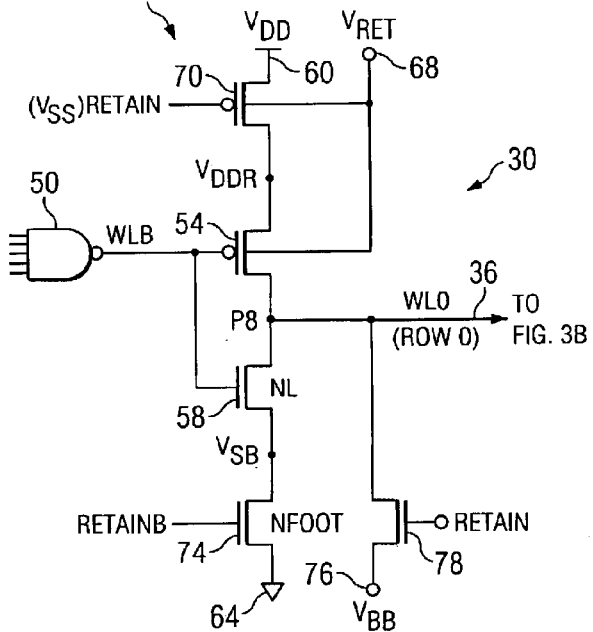
FIG. 3A is a logic diagram illustrating one embodiment of a wordline driver shown in FIG. 2.

FIG. 3A is a logic diagram illustrating one embodiment of wordline driver 30 shown in FIG. 2. Wordline driver 30 comprises a NAND gate 50 coupled to the gates of transistors 54 and 58. Transistors 54 and 58 are serially coupled and has a common node along wordline 36. Transistor 54 couples wordline 36 to $V_{DD}$ node 60. Transistor 58 couples wordline 36 to ground node 64. As shown at FIG. 3A, in this embodiment of wordline driver 30, transistor 54 is a p-type transistor. The bulk (or well) of transistor 54 is coupled to a retention voltage ("$V_{RET}$") node 68 instead of $V_{DD}$ node 60 so that transistor 54 will continue to function as a switch when device 10 assumes a standby mode. $V_{RET}$ is a lower voltage level than normally applied during operation, but is sufficient to maintain data in bit array 34 during the standby mode. In one embodiment, $V_{RET}$ may be approximately 1.2–1.4 volts; however, other levels of voltage may be used depending on the circuitry of memory 16. $V_{RET}$ is provided by a retention voltage source (not explicitly shown). $V_{RET}$ is always on and used to power up bit array 34 during the standby mode. Because $V_{RET}$ is also applied to various portions of bit array 34, leakage current may flow from bit array 34 to nodes 60 and 64 through wordline 36, transistor 54, and transistor 58. According to one embodiment of the invention, a transistor 70 is used to couple transistor 54 to $V_{DD}$ node 60 and a transistor 74 is used to couple transistor 58 to ground node 64. Because transistor 70 is a p-type transistor, the bulk of transistor 70 is coupled to $V_{RET}$ node 68 rather than $V_{DD}$ node 60. As shown in FIG. 3A, when device 10 assumes a standby mode, transistors 70 and 74 operate to block leakage current flowing to nodes 60 and 64. As shown in FIG. 3A, transistors 70 and 74 are controlled by applying retain voltage and retain bar voltage to their respective gates. "Retain voltage" refers to a signal that is asserted high when memory 16 is about to enter a standby mode. "Retain bar voltage" is a complement (or false) signal of retain voltage.

As shown in FIG. 3A, wordline 36 is coupled to a retention power supply voltage ("$V_{BB}$") node 76 by a transistor 78. In one embodiment, the source for $V_{BB}$ is external to memory 16 and referred to as a retention power supply voltage source. In one embodiment, $V_{BB}$ may range from 0V to 0.9V; however, other levels of voltage may be used. When device 10 assumes a standby mode, retain voltage is applied to the gate of transistor 78 to turn on transistor 78. Thus, wordline 36 is operable to be at the voltage level of $V_{BB}$ node 76 when device 10 assumes the standby mode. By raising the voltage level of wordline 36, the voltage level of the bit line and the bit line bar that forms bit array 34 is also raised to $V_{BB}$, which reduces the amount of leakage current flowing through wordline 36, the bit line, and the bit line bar. Additional details concerning the bit line and the bit line bar of bit array 34 are provided below in conjunction with FIG. 3B.

In one embodiment, the voltage level applied to the gate of transistor 70 is adjusted so that a sufficient level of voltage is applied to turn off transistor 70 without causing excessive gate-to-source or gate-to-drain leakage. For example, high voltage applied to the gate of transistor 70 may turn off transistor 70, but instead cause gate-to-source and/or gate-to-drain leakage. To reduce such leakage, the voltage applied to the gate of transistor 70 is lowered. In one embodiment, the voltage applied to the gate of transistor 70 may be below $V_{RET}$ but substantially equal to a source-to-bulk voltage ("$V_{SB}$"), which is raised to $V_{BB}$ during retention mode. $V_{SB}$ refers to the voltage at common nodes of the n-channel transistor pull-down. In one embodiment, in active mode, $V_{SB}$ is equal to $V_{SS}$ or ground. In one embodiment, $V_{SB}$ may be between 0.8V to 1V; however, other levels of voltage may be used depending on the circuitry of memory 16.

Figure 3C:
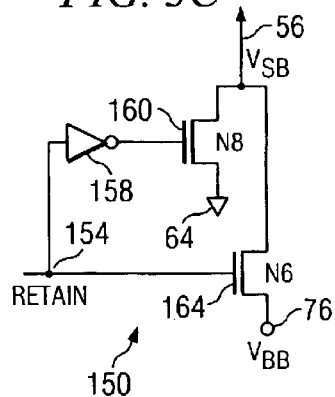
FIG. 3C is a logic diagram illustrating one embodiment of a circuit that may be used to raise the source-to-bulk voltage to equal the retention power supply voltage.
Figure 3B:
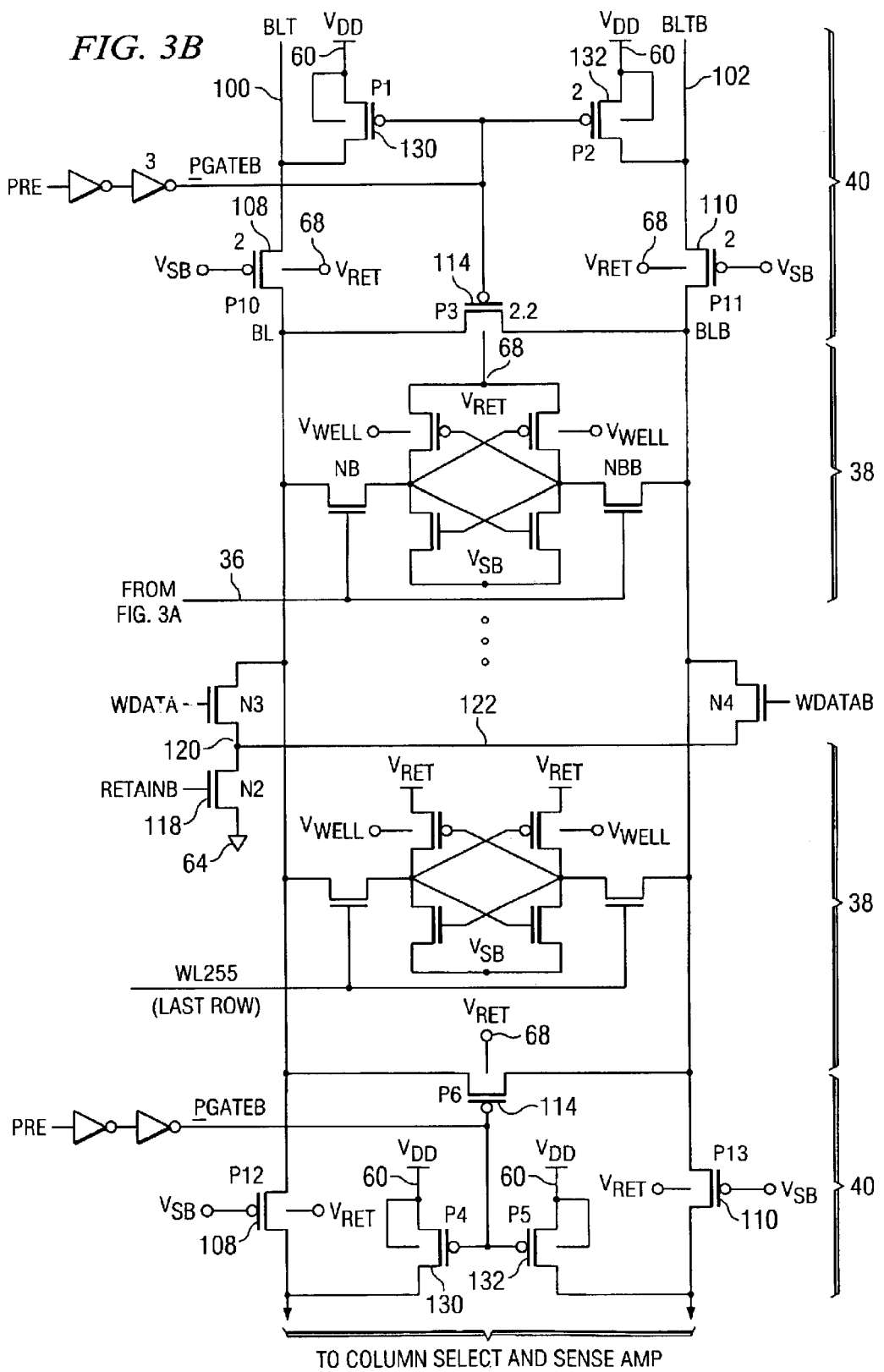
FIG. 3B is a logic diagram illustrating one embodiment of pre-charge circuits and a bit array shown in FIG. 2.

FIG. 3B is a logic diagram illustrating one embodiment of bit array. 34 and pre-charge circuits 40. As shown in FIG. 3B, bit cells 38 that are at the respective ends of bit array 34 are coupled to a pre-charge circuit 40 through a bit line 100 and a bit line bar 102. Bit line bar 102 is also referred to as a complement bit line. In one embodiment, as shown in FIG. 3B, bit cells 38 are positioned along bit line 100 and bit line bar 102 and between two pre-charge circuits 40; one precharge circuit 40 is positioned above a first wordline 36 of bit array 34 and another pre-charge circuit 40 is positioned below of a last wordline 104 of bit array 34. In one embodiment, pre-charge circuit 40 at each end of bit array 34 is configured so that one $V_{DD}$ node 60 is coupled to an end portion of bit line 100 through a transistor 130 and another $V_{DD}$ 60 is coupled to an end portion of bit line bar through a transistor 132. The gates of transistors 130 and 132 share a common node that is coupled to a line identified as "PGATEB," as shown in FIG. 3B. When memory 16 assumes a standby mode, the line identified as "PGATEB" goes to 0 volts, which turns on transistors 130 and 132. Also, $V_{DD}$ at nodes 60 drop to a ground voltage level. Thus, the current leakage from the higher voltage nodes, such as $V_{SB}$, $V_{RET}$, and $V_{WELL}$ nodes ($V_{WELL}$ node is on during standby mode and coupled to an $N_{WELL}$ power voltage supply) within bit array 34, flows through the end portions of bit line 100 and bit line bar 102 to $V_{DD}$ nodes 60 and any other nodes having a lower voltage. Such a configuration is an example of consolidating some leakage paths to a central location.

In one embodiment, to block the leakage of current from flowing to $V_{DD}$ nodes 60, transistors 108 and 110 are positioned between end bit cells 38 and $V_{DD}$ nodes 60 of pre-charge circuits 40. For example, p-type transistors 108 and 110 are used to electrically decouple $V_{DD}$ nodes 60 and bit array 38 when $V_{SB}$ is raised to $V_{BB}$. $V_{SB}$ is raised to $V_{BB}$ by turning on transistor 78 (shown in FIG. 3A) in response to assuming a standby mode. In one embodiment, to reduce the gate current leakage for transistors 108 and 110, $V_{SB}$ (which is equal to $V_{BB}$ during standby mode, in one embodiment) applied to the gates of transistors 108 and 110 is raised only to a level that is sufficient to turn off transistors 108 and 110 without causing excessive gate leakage. In such an embodiment, $V_{SB}$ (and $V_{BB}$) is approximately equal to, but no greater than, $V_{RET}$ that is applied to the respective bulks of transistors 108 and 110. This may be necessary so that the data stored in bit array 34 is not corrupted when device 10 assumes a standby mode. In one embodiment, the voltage difference between $V_{RET}$ and the $V_{SB}$ is approximately 0.4 volts; however, the voltage difference may be greater than or less than 0.4 volts, depending on the particular design of memory 16. In one embodiment, the voltage level of bit line 100 and bit line bar 102 is raised to $V_{BB}$ by turning on transistor 78 when the standby mode is assumed to reduce the leakage current flow through bit line 100 and bit line bar 102.

In one embodiment, a transistor 114 is added to couple bit line 100 and 102 so that when device 10 assumes a standby mode, the voltage levels of bit line 100 and bit line bar 102 are equalized. Again, as shown in FIG. 3B, the bulk of transistor 114 is coupled to $V_{RET}$ node 68. By providing a pre-charge circuitry at the respective ends of bit array 34 and equalizing bit line 100 and bit line bar 102 at $V_{BB}$, most of the leakage current is blocked from flowing to lower voltage nodes.

In one embodiment, a leakage path may exist between bit line 100, bit line bar 102, and ground, through a word data and word data bar shown in FIG. 3B. To block such a path, word data bar and word data may be consolidated at a junction 120 using a line 122. Then, junction 120 is coupled to ground node 64 using a transistor 118. The gate of transistor 118 is coupled to a retain bar voltage, as shown in FIG. 3B. Thus, transistor 118 is turned off when memory 16 assumes a standby mode, which blocks leakage current flowing to ground 64.

FIG. 3C is a logic diagram illustrating one embodiment of a circuit that may be used to raise $V_{SB}$ to $V_{BB}$ in retention mode. Circuit 160 comprises a NOT gate 158, and transistors 160 and 164. A retain voltage node 154 is coupled to the input of NOT gate 158 and the gate of transistor 164. Transistor 164 is coupled to $V_{BB}$ node 76. The output of NOT gate 158 is coupled to the gate of transistor 160. Transistor 160 is coupled to ground node 64 and also coupled to transistor 164 at $V_{SB}$ node 56. When device 10 assumes a standby mode, retain node 154 goes high. In response, NOT gate 158 sends a low signal to the gate of transistor 160. Because transistor 160 is an n-type transistor, transistor 160 is turned off and thus electrically decouples ground node 64 from $V_{SB}$ node 56. However, when retain node 154 goes high, transistor 164 is turned on because transistor 164 is also an n-type transistor. In response, $V_{SB}$ at node 56 is raised to the same voltage as $V_{BB}$ of $V_{BB}$ node 76.

When device 10 is no longer in a standby mode, retain node 154 goes low. In response, transistor 160 is turned on and transistor 164 is turned off. Thus, the $V_{SB}$ at node 56 decreases to the voltage level of ground node 64, which is zero volts in some embodiments.

Although some embodiments of the present invention have been described in detail, it should be understood that various changes, substitutions, and alterations can be made hereto without departing from the spirit and scope of the invention as defined by the appended claims.

What is claimed is:

1. A memory circuit operable to assume a standby mode, comprising:
   a wordline driver having a retain voltage node coupled to a retain voltage source, a driver high voltage node coupled to a high voltage source, a driver low voltage node coupled to a low voltage source, and a plurality of wordline driver leakage paths each coupling the driver high voltage node to the driver low voltage node;
   a bit array having two ends coupled to the wordline driver through a wordline, the bit array formed from a plurality of bit cells serially coupled to each other, end to end, along a bit line and a complement bit line, the bit array having two end bit cells at the two ends of the bit array, respectively, each end bit cell having a bit array high voltage node coupled to the high voltage source;
   a retention power supply voltage source coupled to the bit line and the complement bit line through the wordline;
   two pre-charge circuits respectively coupled to the two end bit cells, each pre-charge circuit having at least one pre-charge low voltage node coupled to the low voltage source, the at least one pre-charge low voltage node coupled to the corresponding bit array high voltage node through a plurality of pre-charge leakage paths;
   wherein the wordline driver further comprises, for each wordline driver leakage path, a first p-type transistor coupling the driver high voltage node to the driver low voltage node, the first p-type transistor having a first gate and a first bulk, the first gate coupled to the retain voltage node, the first bulk coupled to the high voltage source;
   wherein the each pre-charge circuit further comprises, for each pre-charge leakage path, a second p-type transistor coupling the bit array high voltage node to the pre-charge low voltage node, the second p-type transistor having a second gate and a second bulk, the second gate coupled to the retention power supply voltage source, the second bulk coupled to the high voltage source;
   wherein the first and the second p-type transistors are operable to electrically decouple the driver leakage path and the pre-charge leakage path, respectively, in response to a rise in voltage level at the respective first and the second gates, the voltage level at the first and the second gates raised in response to an initiation of the standby mode; and wherein the retain voltage source, the retention power supply voltage source, and the high voltage source are at a substantially equal level of voltage.

2. The memory circuit of claim 1, wherein the retain voltage source is at a first voltage level that is lower than the high voltage source but sufficient to turn off the first p-type transistor, and the retention power supply voltage source is at a second voltage level that is lower than the high voltage source but sufficient to turn off the second p-type transistor.

3. The memory circuit of claim 1, and further comprising an n-type transistor having a third gate, the n-type transistor coupling the bit line and the complement bit line to a ground voltage source; and wherein the n-type transistor is operable to electrically decouple the ground voltage source from the bit line and the complement bit line when a voltage level rise at the third gate occurs in response to an initiation of the standby mode.

4. The memory circuit of claim 1, wherein the low voltage source is an active power supply voltage source that is turned off in response to an initiation of the standby mode.

5. A memory circuit operable to assume a standby mode, comprising:
    a transistor comprising a gate and a bulk, the bulk at a retention voltage level;
    a first node and a second node that are coupled to each other by the transistor, the first node operable to assume a higher voltage level than the second node in response to an initiation of the standby mode;
    a third node coupled to the gate of the transistor, the third node operable to assume a voltage approximately equal to the retention voltage in response to an initiation of the standby mode; and
    wherein the transistor is operable to reduce any direct current flow between the first node and the second node in response to a rise in voltage at the third node to a voltage approximately equal to the retention voltage.

6. The memory circuit of claim 5, wherein the transistor is a p-type transistor, and the voltage level at the third node is less than the retention voltage.

7. The memory circuit of claim 5, and further comprising:
    a pre-charge circuit coupled to an active power supply voltage source;
    a bit array having an end, the bit array formed from a plurality of bit cells serially coupled to each other, end to end, through a bit line, wherein the end of the bit array is coupled to the pre-charge circuit through the bit line;
    wherein the first node is positioned within the bit array along the bit line; and
    wherein the second node is coupled to the active power supply voltage source, the second node positioned within the pre-charge circuit, the active power supply voltage source turned off in conjunction with the initiation of the standby mode.

8. The memory circuit of claim 5, and further comprising a wordline driver coupled to an active power supply voltage source that is turned off in conjunction to the initiation of the standby mode, and wherein the second node is positioned within the wordline driver and coupled to the active power supply voltage source.

9. The memory circuit of claim 5, wherein the transistor is a p-type transistor and the gate is a first gate, and further comprising:
    a wordline driver having the second node;
    a bit array coupled to the wordline driver through a wordline, the bit array having the first node;
    an n-type transistor having a second gate, the n-type transistor coupling the wordline to a retention power supply voltage source, the retention power supply voltage source at the voltage level of the third node and coupled to the first gate of the p-type transistor; and
    wherein the n-type transistor is operable to electrically couple the retention power supply voltage source to the wordline in response to an initiation of the standby mode.

10. The memory circuit of claim 5, wherein the transistor is a first p-type transistor, and further comprising:
    a second p-type transistor having a second gate, the second gate coupled to a pre-charge line, the pre-charge line at zero volts when the memory circuit is at the standby mode;
    a bit array formed from a plurality of bit cells coupled to each other, end to end, through a bit line having an end portion, wherein the first node is positioned along the bit line and the end portion of the bit line is coupled to the second node through the second p-type transistor; and
    wherein the first p-type transistor is positioned in a leakage path between the first node and the second p-type transistor.

11. The memory circuit of claim 5, wherein the higher voltage of the first node is equal to the retention voltage level and the second node is at ground voltage.

12. The memory circuit of claim 5, wherein the transistor is a p-type transistor, and the voltage at the third node is less than the retention voltage level but sufficient to turn off the p-type transistor.

13. The memory circuit of claim 5, wherein the transistor is a p-type transistor, and further comprising:
    an n-type transistor having a second gate coupled to a retain bar voltage source, the n-type transistor coupled to the first node;
    a bit array formed from a plurality of bit cells coupled to each other, end to end, through a bit line, the bit line coupled to ground through the n-type transistor; and
    wherein the n-type transistor is operable to electrically decouple the bit line and ground in response to the initiation of the standby mode.

14. A method for power conservation, comprising:
    for each of a plurality of direct current leakage paths:
        positioning a transistor within the path, the transistor having a gate and a bulk;
        coupling the gate to a retention power supply voltage source;
        coupling the bulk to a retention voltage source;
        wherein the retention power supply voltage source and the retention voltage source are at approximately the same voltage level in response to an initiation of the standby mode; and
        wherein each direct current leakage path is positioned between a first node and a second node of the memory circuit, the first node operable to be at a higher voltage level than the second node in response to an initiation of the standby mode.

15. The method of claim 14, wherein the transistor is a p-type transistor, and the retention power supply voltage source is at a voltage level that is sufficient to turn off the p-type transistor.

16. The method of claim 14, wherein the transistor is a first transistor, and the gate is the first gate, and further comprising:
- providing a bit array formed from a plurality of bit cells coupled to each other, end to end, through a bit line and a complement bit line, the bit array having an end, the bit line and the complement bit line respectively having a bit line end portion and a complement bit line end portion that correspond with the end of the bit array; and
- coupling an active power supply voltage source to the bit line end portion and the complement bit line end portion through a second transistor and a third transistor, respectively, the second transistor having a second gate and the third transistor having a third gate;
- wherein the second gate and the third gate are coupled to a common node;
- wherein the second node is coupled to the active power supply voltage source; and
- wherein the first node is coupled to the retention voltage source.

17. The method of claim 14, wherein the memory circuit comprises a wordline driver, and wherein the first node and the second node are positioned in the wordline driver.

18. The method of claim 14, wherein the memory circuit comprises a bit array having an end portion, and further comprising:
- coupling a pre-charge circuit to the end portion; and
- wherein the first node is positioned in the pre-charge circuit and the second node is positioned in the bit array.

19. The method of claim 14, wherein the transistor is a p-type transistor, and the retention power supply voltage source is operable to be at a lesser voltage level than the retention voltage source but sufficient to turn off the p-type transistor.

20. The method of claim 14, wherein the transistor is a p-type transistor and the gate is a first gate, and further comprising coupling the retention power supply voltage source to the identified direct current leakage paths using an n-type transistor having a second gate, the second gate coupled to a retain bar voltage source.

* * * * *